United States Patent
Waldrop et al.

(10) Patent No.: US 7,675,324 B2
(45) Date of Patent: Mar. 9, 2010

(54) PRE-DRIVER LOGIC

(75) Inventors: William Chad Waldrop, Allen, TX (US); Daniel Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 11/956,099

(22) Filed: Dec. 13, 2007

(65) Prior Publication Data
US 2009/0153191 A1 Jun. 18, 2009

(51) Int. Cl.
H03K 19/094 (2006.01)

(52) U.S. Cl. .............. 326/83; 326/68; 326/81; 326/86; 326/87; 327/109; 327/333

(58) Field of Classification Search ............ 326/56–58, 326/63, 68, 80–83, 86–87; 327/108–109, 327/333
See application file for complete search history.

(56) References Cited

U.S. PATENT DOCUMENTS

| | | | | |
|---|---|---|---|---|
| 5,300,835 A * | 4/1994 | Assar et al. | ................... | 326/68 |
| 5,440,244 A * | 8/1995 | Richter et al. | ................. | 326/37 |
| 6,060,906 A * | 5/2000 | Chow et al. | .................. | 326/81 |
| 6,071,314 A * | 6/2000 | Baxter et al. | .................. | 716/17 |
| 6,262,599 B1* | 7/2001 | Coughlin et al. | ............. | 326/81 |
| 6,512,401 B2* | 1/2003 | Clark et al. | ................. | 327/112 |
| 2006/0091907 A1* | 5/2006 | Khan | .......................... | 326/81 |

* cited by examiner

Primary Examiner—Vibol Tan
Assistant Examiner—Jason Crawford
(74) Attorney, Agent, or Firm—Leffert Jay & Polglaze, P.A.

(57) ABSTRACT

At least one of the disclosed systems includes driver logic that is capable of driving a device and pre-driver logic coupled to the driver logic and that drives the driver logic. If the pre-driver logic receives an input signal of a first type, the pre-driver logic activates a first transistor such that the pre-driver logic provides an output signal. If the pre-driver logic receives an input signal of a second type, the pre-driver logic activates a second transistor and a third transistor that together cause the pre-driver logic to provide a different output signal. If the third transistor is not activated, the pre-driver logic provides the output signal.

25 Claims, 4 Drawing Sheets

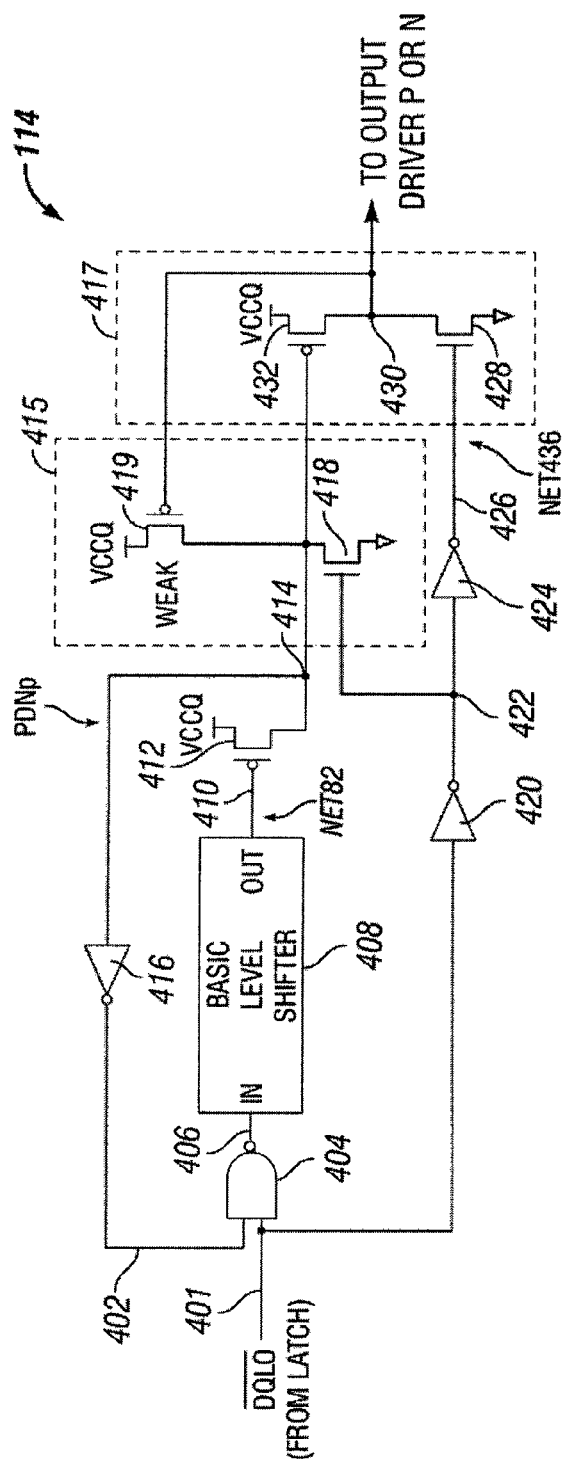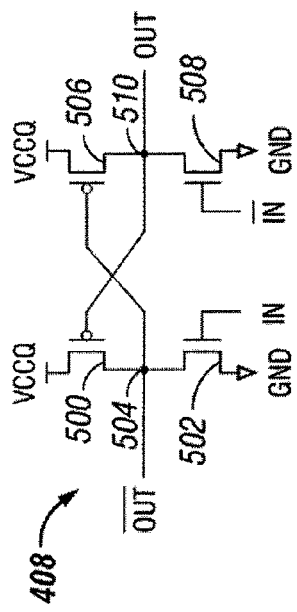
FIG. 4
FIG. 5

PRE-DRIVER LOGIC

BACKGROUND

Integrated circuits (ICs) often operate at multiple voltage levels. For example, an IC may operate at a low voltage level for intra-IC operations and may operate at a relatively higher voltage level when communicating with other electronic devices coupled to the IC (e.g., via an input/output (I/O) port). ICs generally translate between low-level voltages and high-level voltages using translation circuit logic such as drivers, pre-drivers, etc. Unfortunately, such translation circuit logic is undesirably slow.

BRIEF DESCRIPTION OF THE DRAWINGS

For a detailed description of illustrative embodiments of the invention, reference will now be made to the accompanying drawings in which:

FIG. 4 shows illustrative circuit logic implemented in the pre-driver of FIG. 3, in accordance with various embodiments;

FIG. 5 shows additional, illustrative circuit logic implemented in the pre-driver of FIG. 4, in accordance with various embodiments;

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "connection" refers to any path via which a signal may pass. For example, the term "connection" includes, without limitation, wires, traces and other types of electrical conductors, optical devices, etc. Further, there are various transistors described herein having sources and drains. Each source and/or drain may be referred to as "source/drain" or "drain/source" because, in at least some embodiments, the two may be interchangeable. When the "strength" or "weakness" of a transistor is described, it may refer to the ability of that transistor to change or maintain the logical status of a circuit node relative to the ability of another transistor to change the logical status of the circuit node or to maintain a different logical status of the circuit node.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be illustrative of that embodiment, and not intended to intimate that the scope of the disclosure, including the claims, is limited to that embodiment.

Figure 1:
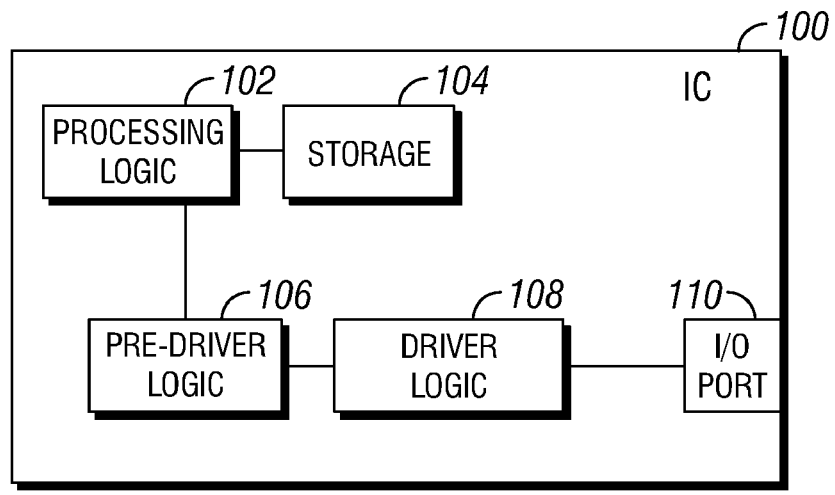
FIG. 1 shows an illustrative IC implementing the techniques disclosed herein, in accordance with various embodiments.

Disclosed herein is a technique by which an integrated circuit (IC) pre-driver is able to translate between low-level voltages and high-level voltages at speeds greater than those possible in ICs not implementing the technique. FIG. 1 shows an illustrative IC 100. The IC 100 comprises processing logic 102, storage 104 (e.g., random access memory (RAM), read-only memory (ROM)), pre-driver logic 106, driver logic 108 and an input/output (I/O) port 110. The IC 100 may be implemented in virtually any electronic device, including personal computers, servers, printers, televisions and handheld electronic devices such as cell phones, digital music players and personal digital assistants (PDAs), other mobile communication devices, gaming consoles, memory (e.g., RAM, dynamic RAM (DRAM), flash memory), as well as electronic devices not explicitly disclosed herein.

In accordance with various embodiments, the pre-driver logic 106 receives one or more signals from the processing logic 102, storage 104, or any other suitable logic on the IC 100. The signals received by the pre-driver logic 106 generally are low-level voltages that are sufficient for intra-IC communications. However, because other electronic devices coupled to the I/O port 110 may operate at higher voltage levels, the pre-driver logic 106 translates the low-level voltages of the IC 100 to higher-level voltages (or, in some embodiments, vice versa) suitable for devices coupled to the I/O port 110. Specifically, the pre-driver logic 106 translates the low-level voltages to high-level voltages and provides the high-level voltages to the driver logic 108 which, in turn, drives the electronic device(s) (shown in FIG. 7) coupled to the I/O port 110.

Figure 2:
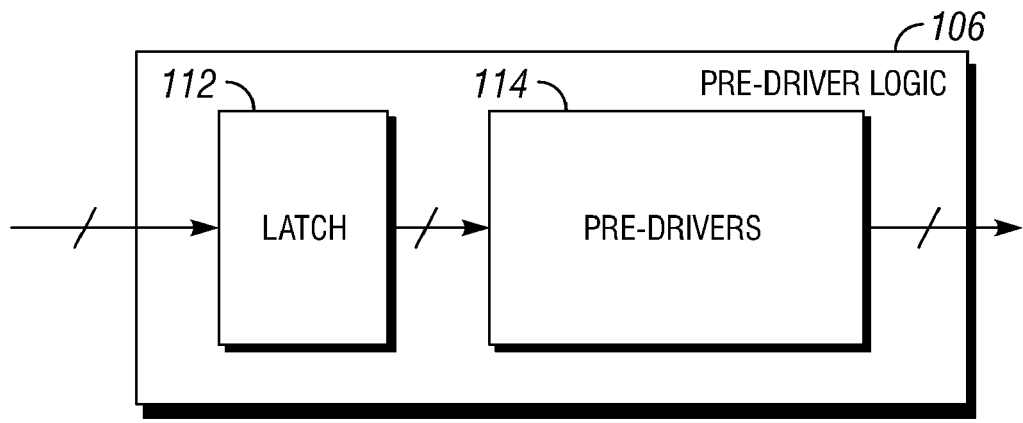
FIG. 2 shows a detailed block diagram of an illustrative driver and an illustrative pre-driver of the IC of FIG. 1, in accordance with various embodiments.

FIG. 2 shows an illustrative block diagram of the pre-driver logic 106. The pre-driver logic 106 comprises latch logic 112 and pre-drivers 114. The latch logic 112 stores signals received from circuit logic (e.g., the processing logic 102) in the IC 100 besides the pre-driver logic 106. The latch logic 112 stores each of these signals for a specific number of clock cycles (e.g., one clock cycle). The latch logic 112 stores these signals to ensure that the output on I/O port 110 is valid for the specific number of clock cycles. The latch logic 112 also simultaneously releases the signals to the pre-drivers 114 for output on the I/O port 110. After the specific number of clock cycles has elapsed, the latch logic 112 will latch the next set of signals from the processing logic 102 and release these signals to the pre-drivers 114 for the next data output on I/O port 110.

Figure 3:
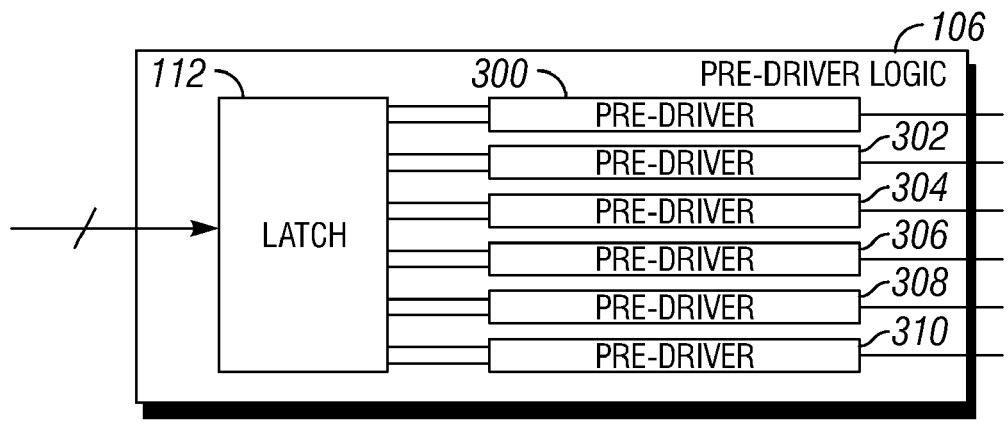
FIG. 3 shows a detailed block diagram of the illustrative pre-driver of FIG. 2, in accordance with various embodiments.

FIG. 3 shows a detailed view of the pre-driver logic 106. In particular, FIG. 3 shows a detailed view of the pre-drivers 114. The pre-drivers 114 include pre-drivers 300, 302, 304, 306, 308 and 310. Any number of pre-drivers may be used. Multiple pre-drivers are used to drive the driver logic 108 because they allow for programmable drive strengths. Each pre-driver 300, 302, 304, 306, 308 and 310 connects to its own driver logic 108. The outputs of all of the driver logic 108 circuits are connected in parallel to the I/O port 110. By using more pre-driver and driver logic pairs, the output drive strength of the I/O port 110 is increased. By using fewer pre-driver and driver logic pairs, the output drive strength of the I/O port 110 is decreased. In some embodiments, the pre-drivers 114 include both pull-up pre-drivers and pull-down pre-drivers. The pull-up pre-drivers are used to "pull up" the output of the driver logic 108 to that of a HIGH level. The pull-down pre-drivers are used to "pull down" the output of the driver logic 108 to that of a LOW level. The interaction between the pre-driver logic 106 and the driver logic 108 is described in detail below.

FIG. 4 shows a detailed view of an illustrative pre-driver 114. The pre-driver 114 comprises a NAND gate 404 having multiple input signals. One of the multiple input signals is provided via node 401, while another one of the multiple input signals is provided via node 402. The NAND gate 404 produces an output signal on node 406. The signal output onto node 406 is input into translation logic 408. The translation logic 408 outputs a signal onto node 410, which is coupled to the gate of a p-channel transistor 412.

The source/drain of p-channel transistor 412 couples to a HIGH voltage level (VCCQ) so that, when the transistor is activated, the voltage VCCQ is output on the drain/source of transistor 412. The voltage VCCQ may be any suitable voltage level (e.g., 1.6V, 3.6V). The output of the p-channel transistor 412 is provided to node 414. Node 414 is an input to inverter 416. The output of inverter 416 is provided to node 402. Node 414 also couples to multiple transistor combinations. In particular, node 414 couples to transistor combination 415 and 417. Transistor combination 415 comprises a p-channel transistor 419 that couples to the voltage VCCQ so that, when the transistor 419 is activated, the voltage VCCQ is output (i.e., the source/drain output of transistor 419 at node 414 is pulled toward VCCQ). The gate to the transistor 419 couples to node 430, which is the output of transistor combination 417. The transistor combination 415 also comprises an n-channel transistor 418 that couples to ground (GND) so that, when the transistor 418 is activated, the source/drain of the transistor 418 (node 414) is pulled toward GND. The transistor combination 417 comprises a p-channel transistor 432. When activated, the p-channel transistor 432 outputs VCCQ onto node 430. The transistor combination 417 also comprises an n-channel transistor 428. When activated, the n-channel transistor 428 pulls the source/drain output of the transistor 428 (node 430) toward GND.

Referring still to FIG. 4, node 401 couples to an input of the inverter 420. The output of inverter 420 couples to node 422. Node 422 couples to the gate of the transistor 418. Node 422 also couples to an input of the inverter 424. The output of inverter 424 couples to node 426. In turn, node 426 couples to the gate of the transistor 428.

The embodiments described above and shown in FIG. 4 are illustrative of possible circuit logic that may be used to implement the technique disclosed herein. However, any of the circuit logic shown in FIG. 4 may be substituted with different, suitable circuit logic, provided that the general principles of the technique, as described herein, are still implemented. For example, in some embodiments, p-channel transistors may be substituted for n-channel transistors and/or n-channel transistors may be substituted for p-channel transistors. The scope of this disclosure is intended to capture any and all such variations and modifications to the pre-driver 114 shown in FIG. 4.

In operation, node 401 receives a signal from latch logic 112. The signal on node 401 is inverted by inverter 420. The output of inverter 420 is provided to the gate of n-channel transistor 418. The n-channel transistor 418 is activated when the signal at node 422 is HIGH. Thus, when the signal at node 401 is LOW, the n-channel transistor 418 is activated. When the signal at node 401 is HIGH, the n-channel transistor 418 is inactivated.

When the n-channel transistor 418 is activated, the node 414 is driven LOW, because the source/drain of n-channel transistor 418 couples to GND. When the node 414 is driven LOW, the p-channel transistor 432 is activated, thereby driving the source/drain of the p-channel transistor 432 (at node 430) HIGH. Because the n-channel transistor 428 is not activated when the p-channel transistor 432 is activated, the p-channel transistor 432 is able to "easily" drive the output node 430 HIGH.

Referring again to node 401, when the signal at node 401 is HIGH, the n-channel transistor 418 is inactivated, and the n-channel transistor 428 is activated. When the n-channel transistor 428 is activated, the node 430 is pulled LOW toward GND. However, in at least some cases, the n-channel transistor 428 may not be able to easily pull the node 430 LOW. To ensure that the n-channel transistor 428 is able to pull the node 430 LOW when node 401 is HIGH, it should be ensured that the p-channel transistor 432 is completely, or at least significantly, inactivated, so that the n-channel transistor 428 does not have to "fight" the p-channel transistor 432 over the logic state of the node 430.

To ensure that the p-channel transistor 432 is completely or almost completely inactivated when the n-channel transistor 428 is activated, the output node 430 couples to the gate of the p-channel transistor 419. Because the status of node 430 is sufficiently low so that the p-channel transistor may be activated, the node 414 is pulled toward VCCQ. However, the p-channel transistor 419 may be weak and so may be unable to fully drive the node 414 HIGH, thereby ensuring that the p-channel transistor 432 is inactivated. Thus, to assist the weak p-channel transistor 419 in fully driving the node 414 HIGH, the node 414 is coupled to the NAND gate 404 via the inverter 416.

In particular, the gate 404, translation logic 408 and p-channel transistor 412 together ensure that, when the weak p-channel transistor 419 is activated, the node 414 is fully driven HIGH, thereby ensuring the inactivation of the p-channel transistor 432. Stated otherwise, the strength of the combination of the p-channel transistors 412 and 419 is greater than the strength of the n-channel transistor 418. However, the gate 404, translation logic 408 and p-channel transistor 412 are configured so that as soon as the node 414 is driven HIGH, the gate 404, translation logic 408 and p-channel transistor 412 cease forcing node 414 HIGH. This forceful driving of the node 414, now described in detail, enables translation circuit logic to quickly translate voltages.

As mentioned, when the weak p-channel transistor 419 is activated, it may need additional assistance in fully driving the node 414 HIGH to ensure that the p-channel transistor 432 is inactivated, thereby ensuring a "clean" LOW output at node 430. Accordingly, if, despite the activation of the weak p-channel transistor 419, the overall status of node 414 still remains LOW, the inverter 416 inverts this signal to HIGH and provides it to the NAND gate 404. The node 401, which is HIGH, and the node 402, which also is HIGH, both cause the NAND gate to output a LOW signal on the node 406. The LOW signal on node 406 is provided to the translation logic 408, which translates the signal on node 406 to a different voltage level on node 410.

Referring briefly to both FIGS. 4 and 5, there is shown an illustrative translation logic 408 (also referred to as a "shifter" or "level shifter"). The translation logic 408 comprises a p-channel transistor 500, an n-channel transistor 502 and a node 504 coupled to both the p-channel transistor 500 and the n-channel transistor 502. The translation logic 408 also comprises a p-channel transistor 506, an n-channel transistor 508, and a node 510 coupled to both the p-channel transistor 506 and the n-channel transistor 508. The node 406 of FIG. 4 couples to the input node/gate (IN) of n-channel transistor 502. An inverse of the signal at node 406 couples to the input node/gate of n-channel transistor 508. The output node (OUT) of the translation logic 408 couples to node 510, which in turn couples to the gate of the p-channel transistor 500. An inverse of the signal at the OUT node of the translation logic 408 couples to node 504 which, in turn, couples to the input of the p-channel transistor 506. The output node 510 couples to the node 410 of FIG. 4. In at least some embodiments, the inverse of the input (IN) is provided to the n-channel transistor 508 from node 406 via an inverter (not specifically shown). Similarly, in at least some embodiments, the inverse output coupled to node 504 couples to the node 410 via an inverter (not specifically shown). The sources/drains of n-channel transistors 502 and 508 couple to GND, while the sources/drains of p-channel transistors 500 and 506 couple to VCCQ (e.g., 1.6V, 3.6V). Thus, when a signal at node 406 is LOW, the n-channel transistor 508 is activated, thereby driving the node 410 toward GND. Similarly, when the signal at node 406 is HIGH, the n-channel transistor 502 is activated, thereby activating p-channel transistor 506, and thereby driving OUT and thus the node 410 toward VCCQ.

Referring again to FIG. 4, the status of the signal at node 410 determines whether the p-channel transistor 412 will be activated or inactivated. When the signal at node 414 is LOW (i.e., the weak p-channel transistor 419 has been unable to drive the node 414 HIGH by itself and requires assistance), the logic state of the signal at node 410 is LOW. Accordingly, the p-channel transistor 412 is activated, and the p-channel transistor 412 thus drives the node 414 to a HIGH state. In this way, the weak p-channel transistor 419, which is attempting to drive the node 414 HIGH, is provided with assistance from the strong p-channel transistor 412. Because both the p-channel transistors 412 and 419 are driving the node 414 HIGH, the node 414 is fully (or almost fully) driven HIGH, thereby completely (or almost completely) inactivating the p-channel transistor 432.

Once the node 414 has been driven HIGH and the p-channel transistor 432 has been inactivated, it may be unnecessary for the p-channel transistor 412 to remain continuously activated. Accordingly, when the node 414 is HIGH, the output of the NAND gate 404 at node 406 is driven HIGH. In turn, the translation logic 408 drives the node 410 HIGH, thereby inactivating the p-channel transistor 412. When the p-channel transistor 412 is inactivated, the node 414 is kept HIGH only by the p-channel transistor 419. If, for any of a variety of reasons, the p-channel transistor 419 is unable to keep the node 414 from becoming LOW, the p-channel transistor 412 will be re-activated, thereby forcing the node 414 HIGH again.

Figure 6:
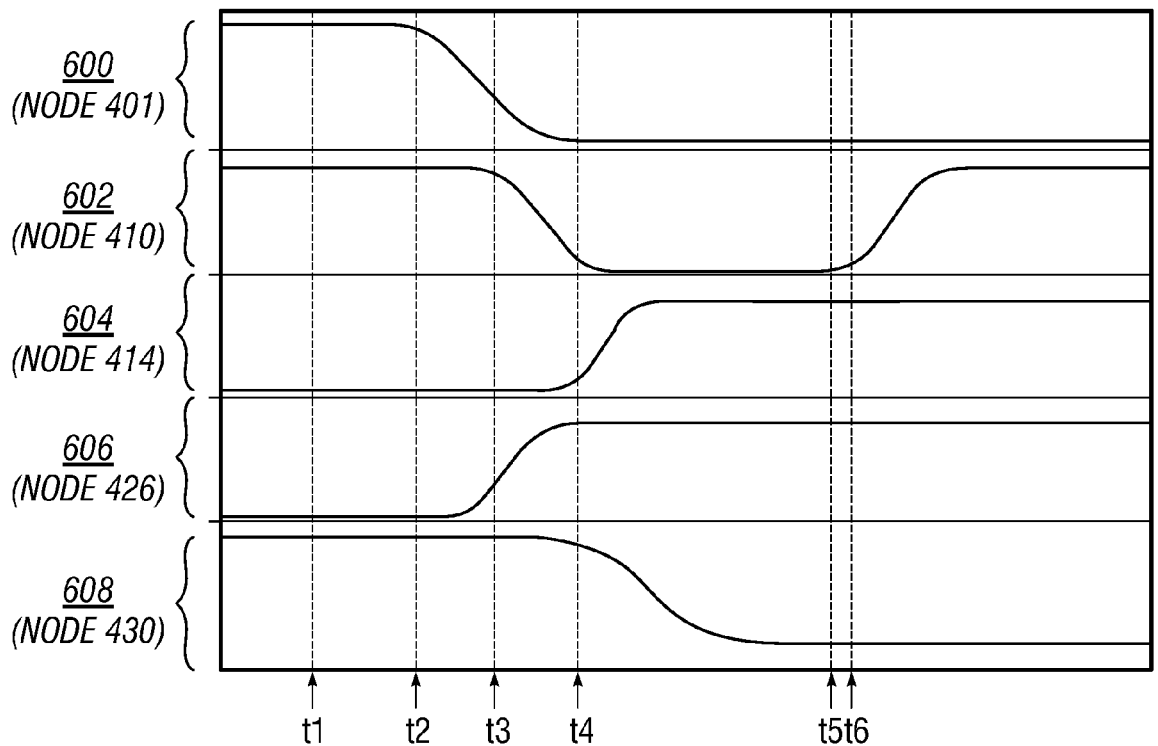
FIG. 6 shows simulation graphs of the circuit logic of FIGS. 4-5, in accordance with various embodiments.

FIG. 6 shows a plurality of simulation signals indicative of the operation of the pre-driver 114. In particular, referring to FIGS. 4 and 6, signal 600 is indicative of the inverse of the voltage at node 401. Signal 602 is indicative of the voltage at node 410. Signal 604 is indicative of the voltage at node 414. Signal 606 is indicative of the voltage at node 426. Signal 608 is indicative of the voltage at node 430. The y-axis of each of the simulation signals is indicative of the voltage of those signals. The x-axis of each of the simulation signals is indicative of time.

At time t1, the signal 600 is HIGH, meaning that the voltage at node 401 is LOW. Also at time t1, the signal 604 is LOW, indicating that the voltage at node 414 is LOW. Because node 414 is LOW and node 401 is LOW, the output of the NAND gate at node 406 is HIGH, thereby resulting in node 410 being HIGH, as indicated by signal 602. Because node 401 is LOW, node 422 is HIGH and node 426 is LOW, as indicated by signal 606. Because node 426 is LOW, the n-channel transistor 428 is not activated. However, because node 422 is HIGH, the n-channel transistor 418 is activated, thereby pulling node 414 LOW (as indicated by signal 604). Because node 414 is LOW, the p-channel transistor 432 is activated, thereby pulling node 430 HIGH, as indicated by signal 608.

At time t2, the signal 600 begins to fall LOW, meaning that the voltage at node 401 begins to go HIGH. As a result, node 422 is driven LOW, thereby inactivating the n-channel transistor 418. However, node 426 is driven HIGH (as indicated by signal 606), thereby activating the n-channel transistor 428. Because the n-channel transistor 428 is activated, the node 430 is pulled toward GND. However, as previously described, the n-channel transistor 428 may have to "fight" the p-channel transistor 432 and may be unable to drive the node 430 LOW. This fact is indicated by signal 608 at time t2, which, despite activation of the n-channel transistor 428, remains HIGH. Accordingly, to prevent the n-channel transistor 428 from having to "fight" the p-channel transistor 432, it is desirable to ensure that the p-channel transistor 432 is fully inactivated by ensuring that the node 414 is fully HIGH. Accordingly, the p-channel transistor 419 is activated. However, because the p-channel transistor 419 is weak, the p-channel transistor 419 may require assistance in driving the node 414 HIGH. Thus, if node 414 is still LOW despite activation of the p-channel transistor 419 (as is indicated by signal 604 at time t2), the node 402 is driven HIGH, thereby causing the node 410 to be driven LOW (as indicated by signal 602 at time t3) and activating the p-channel transistor 412. Because the p-channel transistor 412 is activated, the node 414 is driven HIGH (as indicated by signal 604 at time t4). Because the node 414 is driven HIGH, the p-channel transistor 432 is inactivated, thereby enabling the n-channel transistor 428 to drive the node 430 LOW (as indicated by signal 608 at time t4).

However, as described above, when the node 414 is driven HIGH and the p-channel transistor 432 is inactivated, the p-channel transistor 412 also is inactivated. The p-channel transistor 412 may be inactivated in this way for various reasons (e.g., to conserve power). More specifically, when the node 414 is HIGH (as indicated by signal 604 at time t5), the node 402 is driven LOW, and the node 406 is driven HIGH. As a result, the node 410 is driven HIGH (as indicated by signal 602 at time t6), thereby causing the p-channel transistor 412 to be inactivated. As long as the node 414 remains HIGH, the p-channel transistor 412 remains inactivated. However, if the node 414 begins to dip LOW, the p-channel transistor 412 is re-activated to pull the node 414 back HIGH, provided that the n-channel transistor 428 and p-channel transistor 419 are activated.

Figure 7:
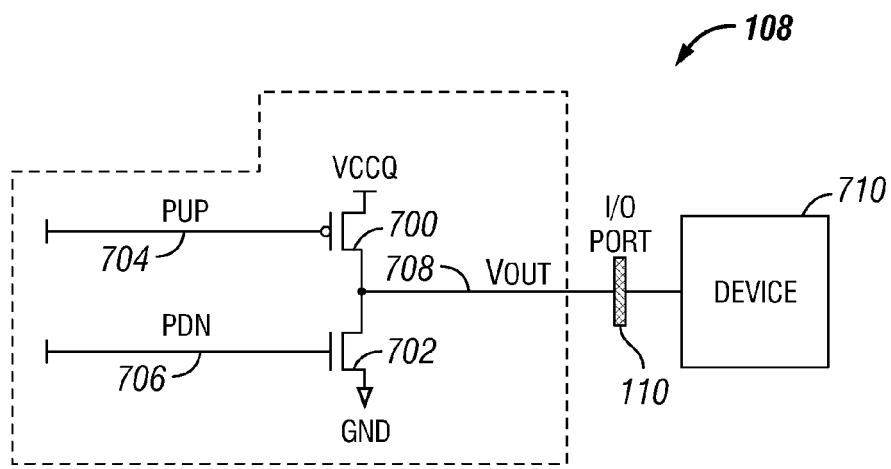
FIG. 7 shows illustrative circuit logic implemented in the driver of FIG. 2, in accordance with various embodiments.

Referring again to FIG. 1, the pre-drivers in the pre-driver logic 106 are used to drive the driver logic 108. FIG. 7 shows illustrative driver logic 108. The driver logic 108 drives any suitable end device, such as electronic device 710. The driver logic 108 comprises a p-channel transistor 700, whose source/drain connects to VCCQ, and an n-channel transistor 702, whose source/drain connects to GND. The p-channel transistor 700 receives an input signal 704 on its gate and the n-channel transistor 702 receives an input signal 706 on its gate. The source/drain of p-channel transistor 700 and the source/drain of n-channel transistor 702 couple at node 708. The output of the transistors drives the node 708. The driver logic 108, as shown in FIG. 7, comprises only two input signals—a pull-up signal (PUP) 704 and a pull-down signal (PDN) 706. The PUP 704 is received from one pre-driver 114 (e.g., such as that described in FIG. 4) and the PDN 706 is received from another pre-driver 114 (e.g., such as that described in FIG. 4). Depending on the input signals provided to the pre-drivers 114, either the PUP 704 or the PDN 706 is activated or neither is activated. If the PUP 704 and the PDN 706 both are HIGH, the n-channel transistor 702 is activated, thereby pulling the output node 708 (VOUT) toward GND (i.e., LOW). If the PUP 704 and the PDN 706 both are LOW, the p-channel transistor 704 is activated, thereby pulling the output node 708 toward VCCQ (i.e., HIGH). The output node 708 couples to the I/O port 110 shown in FIG. 1. In this way, the driver logic 108 drives the electronic device 710 coupled to the I/O port 110. If the PUP 704 is high and the PDN 706 is low, the output node 708 is no longer driven by the driver logic 108 and the I/O port 110 may be used for data input.

The driver logic 108 shown in FIG. 7 is simplified for ease of explanation. In particular, the driver logic 108 shows only two input signals—the pull-up signal (PUP) 704 and the pull-down signal (PDN) 706. As mentioned, the PUP 704 couples to one pre-driver 114 and the PDN 706 couples to another pre-driver 114. However, in some embodiments, the driver logic 108 may comprise multiple input signals coupled to different p-channel and/or n-channel transistors, with each of the multiple input signals coupled to a separate pre-driver 114. For example, referring to FIG. 3, each of the pre-drivers 300, 302, 304, 306, 308 and 310 may couple to a different p-channel transistor or n-channel transistor in the driver logic 108. In some embodiments, each of the pre-drivers 300, 302 and 304 couples to a p-channel transistor, while each of the pre-drivers 306, 308 and 310 couples to an n-channel transistor. Various such combinations and modifications are encompassed within the scope of this disclosure.

Figure 8:
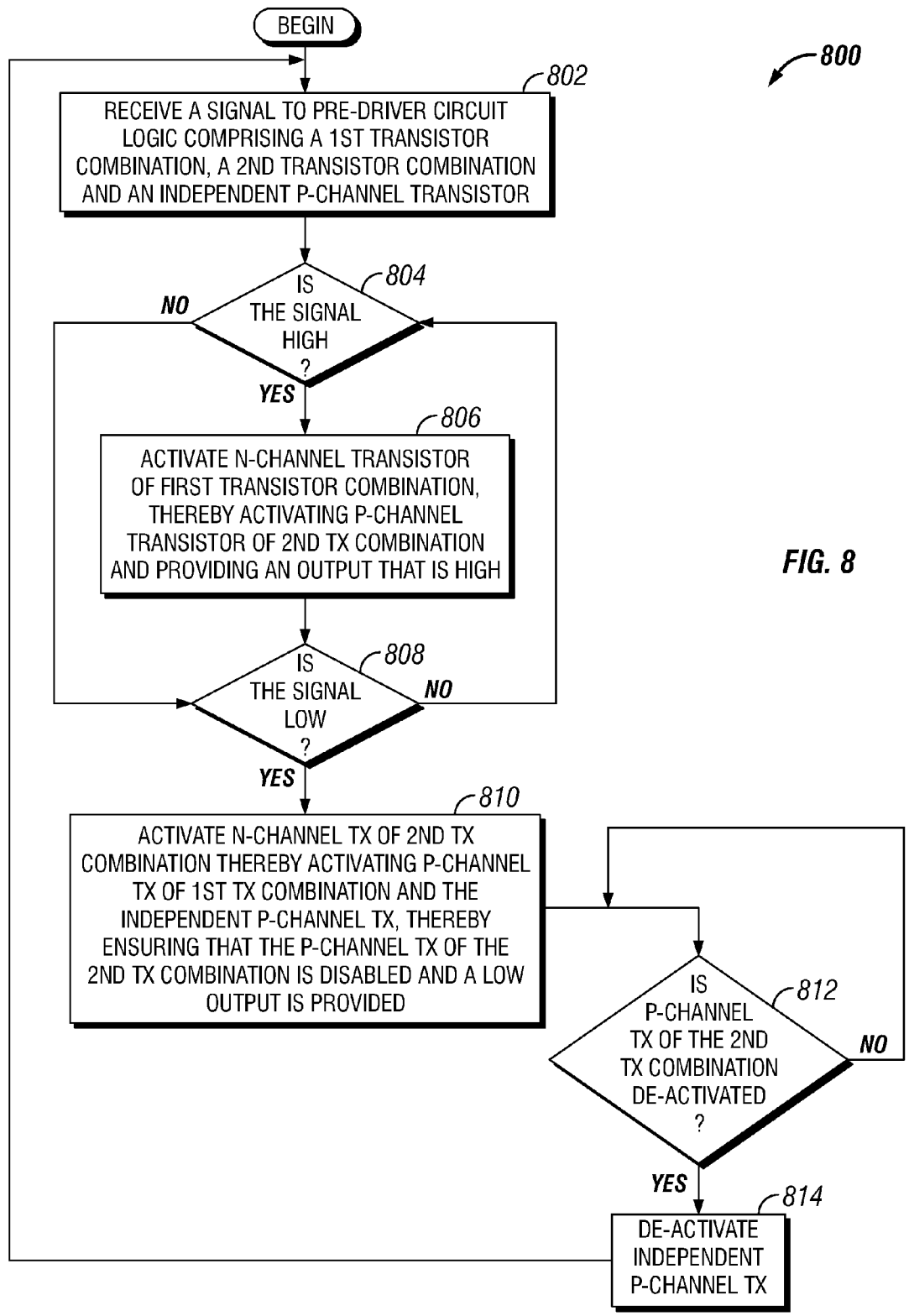
FIG. 8 shows a flow diagram of an illustrative method implemented in accordance with various embodiments.

FIG. 8 shows a flow diagram of an illustrative method 800 implemented in accordance with various embodiments. The method 800 begins by receiving a signal to a pre-driver logic comprising a first transistor combination, a second transistor combination and an independent, p-channel transistor (block 802). The method 800 continues by determining whether the received signal is HIGH (block 804). If so, the method 800 comprises activating the n-channel transistor of the first transistor combination, thereby activating the p-channel transistor of the second transistor combination and providing an output that is HIGH (block 806). Otherwise, control of the method 800 is provided to block 808.

The method 800 then comprises determining whether the received signal is LOW (block 808). If not, control of the method 800 returns to block 804. If, however, the received signal is LOW, the method 800 comprises activating the n-channel transistor of the second transistor combination, thereby activating the p-channel transistor of the first transistor combination and the independent p-channel transistor (block 810). In this way, it is ensured that the p-channel transistor of the second transistor combination is disabled and that a LOW output is provided (block 810).

The method 800 then comprises determining whether the p-channel transistor of the second transistor combination is inactivated (block 812). If so, the method 800 comprises inactivating the independent p-channel transistor (block 814). Otherwise, control of the method 800 returns to block 812. The various portions of the method 800 may be performed in any suitable order and may be adjusted or adapted as necessary to suit implementation in different applications.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
    driver logic capable of driving a device;
    pre-driver logic coupled to the driver logic and that drives the driver logic;
    wherein, if the pre-driver logic receives an input signal of a first type, the pre-driver logic activates a first transistor such that the pre-driver logic provides a first output signal;
    wherein, if the pre-driver logic receives an input signal of a second type, the pre-driver logic activates a second transistor and a third transistor that together cause the pre-driver logic to provide a second output signal;
    wherein, if the third transistor is not activated, the pre-driver logic provides said first output signal; and
    wherein the second transistor is activated only when the third transistor is activated and where the pre-driver logic is outputting a third output signal, the third output signal having an output level between an output level of the first output signal and an output level of the second output signal.

2. The system of claim 1, wherein the system comprises an apparatus selected from the group consisting of a random access memory (RAM), a dynamic random access memory (DRAM), a flash memory and a computer.

3. The system of claim 1, wherein said first transistor comprises an n-channel transistor and said second and third transistors comprise p-channel transistors.

4. The system of claim 1, wherein, the output level of the first output signal is greater than the output level of the second output signal.

5. The system of claim 1, wherein the first transistor is stronger than the second transistor but is weaker than the second and third transistors combined.

6. Pre-driver logic, comprising:
    a first transistor combination;
    a second transistor combination coupled to the first transistor combination; and
    a separate transistor coupled to the first transistor combination;
    wherein, when a first type of input signal is received, a first transistor in the first transistor combination causes the second transistor combination to drive a first output signal to a first voltage level;
    wherein, when a second type of input signal is received, a second transistor in the first transistor combination and said separate transistor together cause the second transistor combination to drive the output signal to a second voltage level;
    wherein, when the output signal reaches said second voltage level, the separate transistor is inactivated.

7. The pre-driver logic of claim 6, wherein said first transistor comprises an n-channel transistor, the second transistor comprises a p-channel transistor, and the separate transistor comprises a p-channel transistor.

8. The pre-driver logic of claim 6, wherein said second voltage level is lower than said first voltage level.

9. The pre-driver logic of claim 6 further comprising a translation logic that adjusts a voltage provided to the separate transistor.

10. The pre-driver logic of claim 6, wherein, when the output signal is driven to said second voltage level, a p-channel transistor in the second transistor combination is inactivated.

11. A system, comprising:
a first transistor combination;
a second transistor combination coupled to the first transistor combination; and
a separate transistor coupled to the first and second transistor combinations;
wherein, when a first input signal is received, a first type of transistor in the first
transistor combination is activated, thereby activating a second type of transistor in the second transistor combination and resulting in an output signal that corresponds to the first input signal;
wherein, when a second input signal is received, a transistor of said first type in the second transistor combination is activated, thereby activating another transistor of said second type in the first transistor combination, thereby activating said separate transistor and causing said second type of transistor in the second transistor combination to be inactivated, thereby causing the output signal to correspond to the second input signal; and
wherein said separate transistor is activated only when the output signal does not correspond to the first input signal and the second input signal.

12. The system of claim 11, wherein said separate transistor is of said second type.

13. The system of claim 11, wherein said second type of transistor comprises a p-channel transistor.

14. The system of claim 11, wherein said first type of transistor comprises an n-channel transistor.

15. The system of claim 11, wherein said system comprises a device selected from the group consisting of dynamic random access memory (DRAM), random access memory (RAM), flash memory, a mobile communication device, a computer, a gaming console and a digital music device.

16. The system of claim 11 further comprising a translation logic that increases the voltage of the first input signal or the second input signal before the input first input signal or second input signal is provided to the separate transistor.

17. A system, comprising:
a NAND gate;
a p-channel transistor coupled to the NAND gate via a level shifter, said p-channel transistor also coupled to an inverter at a first node, the inverter coupled to the NAND gate;
a first transistor combination comprising a first p-channel transistor and a first n-channel transistor, the first p-channel transistor and the first n-channel transistor coupled at said first node;
a second transistor combination comprising a second p-channel transistor and a second n-channel transistor, an input to the second p-channel transistor coupled to the first node, an input to the second n-channel transistor coupled to an input to the first n-channel transistor at a second node via an inverter, said second node coupled to an input of the NAND gate via another inverter, the second p-channel and second n-channel transistors coupled via a third node that couples to an input to the first p-channel transistor.

18. The system of claim 17, wherein each of said p-channel transistors, when activated, outputs a first voltage level, and each of said n-channel transistors, when activated, outputs a voltage level that is lower than the first voltage level.

19. The system of claim 17, wherein an input to the level shifter couples to an output of the NAND gate, an output of the level shifter couples to an input of the p-channel transistor, the input to the level shifter couples to a third n-channel transistor of a third transistor combination, said third transistor combination comprising a third p-channel transistor coupled to the third n-channel transistor;
wherein an input to the third p-channel transistor couples to a third node, said third node couples to a fourth n-channel transistor and to a fourth p-channel transistor, said output of the level shifter coupled to the third node.

20. The system of claim 17, wherein said system comprises a memory device selected from the group consisting of random access memory (RAM), dynamic random access memory (DRAM) and flash memory.

21. The system of claim 17, wherein said first p-channel transistor is weaker than said first n-channel transistor.

22. The system of claim 17, wherein the p-channel transistor and the first p-channel transistor have a combined strength greater than that of the first n-channel transistor.

23. A system, comprising:
means for receiving an input signal;
means for activating, if the input signal is of a first type, an n-channel transistor of a first transistor combination, thereby activating a p-channel transistor of a second transistor combination and providing an output signal that is of said first type;
means for activating, if the input signal if of a second type, a p-channel transistor of the first transistor combination and an independent transistor, thereby causing the p-channel transistor of the second transistor combination to be disabled and causing the output signal to be of said second type;
means for de-activating, if said p-channel transistor of the second transistor combination is de-activated, the independent transistor.

24. The system of claim 23, wherein said independent transistor comprises a p-channel transistor.

25. The system of claim 23, wherein the means for receiving comprises a NAND gate and a level shifter, an output of the level shifter couples to an input of the independent transistor, an input to the NAND gate couples to a latch.

* * * * *

UNITED STATES PATENT AND TRADEMARK OFFICE
CERTIFICATE OF CORRECTION

| | | |
|---|---|---|
| PATENT NO. | : 7,675,324 B2 | Page 1 of 1 |
| APPLICATION NO. | : 11/956099 | |
| DATED | : March 9, 2010 | |
| INVENTOR(S) | : William Chad Waldrop et al. | |

It is certified that error appears in the above-identified patent and that said Letters Patent is hereby corrected as shown below:

In column 9, line 46, in Claim 16, delete "input first" and insert -- first --, therefor.

Signed and Sealed this

Twenty-fifth Day of May, 2010

David J. Kappos
*Director of the United States Patent and Trademark Office*